United States Patent
Masubuchi

(10) Patent No.: US 11,379,027 B2
(45) Date of Patent: Jul. 5, 2022

(54) ELECTRONIC DEVICE AND INFORMATION RECORDING METHOD OF ELECTRONIC DEVICE

(71) Applicant: Kioxia Corporation, Tokyo (JP)

(72) Inventor: Hayato Masubuchi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 503 days.

(21) Appl. No.: 16/549,464

(22) Filed: Aug. 23, 2019

(65) Prior Publication Data
US 2020/0301495 A1 Sep. 24, 2020

(30) Foreign Application Priority Data
Mar. 18, 2019 (JP) .............................. JP2019-050041

(51) Int. Cl.
| | |
|---|---|
| *G06F 1/28* | (2006.01) |
| *G11C 14/00* | (2006.01) |
| *G11C 16/10* | (2006.01) |
| *G11C 16/30* | (2006.01) |
| *G11C 5/14* | (2006.01) |

(52) U.S. Cl.
CPC ............... *G06F 1/28* (2013.01); *G11C 5/143* (2013.01); *G11C 5/144* (2013.01); *G11C 14/0018* (2013.01); *G11C 16/10* (2013.01); *G11C 16/30* (2013.01)

(58) Field of Classification Search
CPC ........... G06F 1/28; G11C 5/143; G11C 5/144; G11C 14/0018; G11C 16/10; G11C 16/30
See application file for complete search history.

(56) References Cited

U.S. PATENT DOCUMENTS

| | | | |
|---|---|---|---|
| 8,151,130 B2 * | 4/2012 | Eto ........................... | G06F 1/30 |
| | | | 712/229 |
| 9,383,795 B2 | 7/2016 | Stenfort | |
| 9,563,249 B2 | 2/2017 | Lin | |
| 9,778,988 B2 | 10/2017 | Huang | |
| 10,837,990 B2 * | 11/2020 | Saito ................ | G01R 19/16538 |
| 11,093,167 B2 * | 8/2021 | Masubuchi ............ | G11C 5/144 |
| 2013/0119956 A1 * | 5/2013 | Cho ........................ | G05F 1/468 |
| | | | 323/283 |
| 2018/0316180 A1 | 11/2018 | Batenburg et al. | |

FOREIGN PATENT DOCUMENTS

TW            201820144 A      6/2018

* cited by examiner

*Primary Examiner* — Vanthu T Nguyen
(74) *Attorney, Agent, or Firm* — Foley & Lardner LLP

(57) ABSTRACT

An electronic device includes a power supply circuit, a first counter that counts the number of times that supply of external power to the power supply circuit is stopped, a second counter that is operated by a first power and counts the number of times that generation of the plurality of kinds of power is stopped, a third counter counting the number of times that any of the plurality of kinds of power is dropped to a predetermined voltage or less, a non-volatile first memory storing status information indicating whether or not supply of the external power to the power supply circuit is properly stopped, and a fourth counter that counts the number of times that the supply of the external power to the power supply circuit is properly stopped and the number of times that the supply of the external power to the power supply circuit is abnormally stopped.

11 Claims, 8 Drawing Sheets

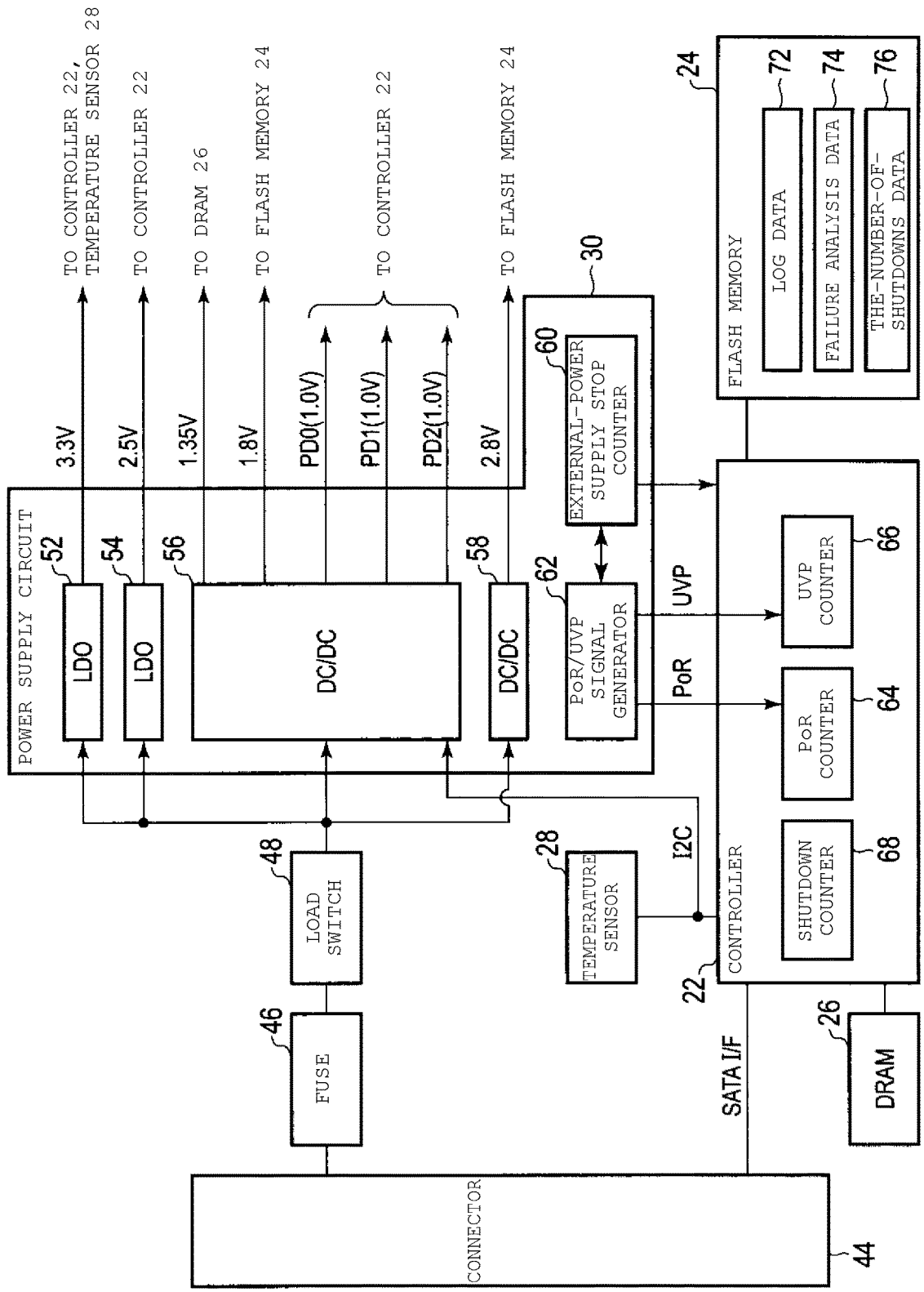

FIG. 3

| TIME | FAILURE ANALYSIS DATA 74 | | | | | | |
|---|---|---|---|---|---|---|---|
| | EXTERNAL -POWER SUPPLY STOP COUNTER 60 | PoR COUNTER 64 | UVP COUNTER 66 | SHUTDOWN COUNTER 68 | | POWER STATUS | |
| | | | | NUMBER OF PROPER SHUTDOWNS | NUMBER OF IMPROPER SHUTDOWNS | EXTERNAL POWER | POWER SUPPLY CIRCUIT 30 |
| $t_{i-1}$ | * | * | * | * | * | PROPER SUPPLY STOP | PROPER STOP |
| $t_i$ | *+1 | *+1 | * | *+1 | * | PROPER SUPPLY STOP | PROPER STOP |

FIG. 4

| THE-NUMBER-OF-SHUTDOWNS DATA 76 | | | |
|---|---|---|---|
| EXTERNAL POWER | | POWER SUPPLY CIRCUIT 30 | |
| NUMBER OF PROPER SUPPLY STOPS | NUMBER OF IMPROPER SUPPLY STOPS | NUMBER OF PROPER STOPS | NUMBER OF ABNORMAL STOPS |
| ** | ** | ** | ** |

FIG. 5

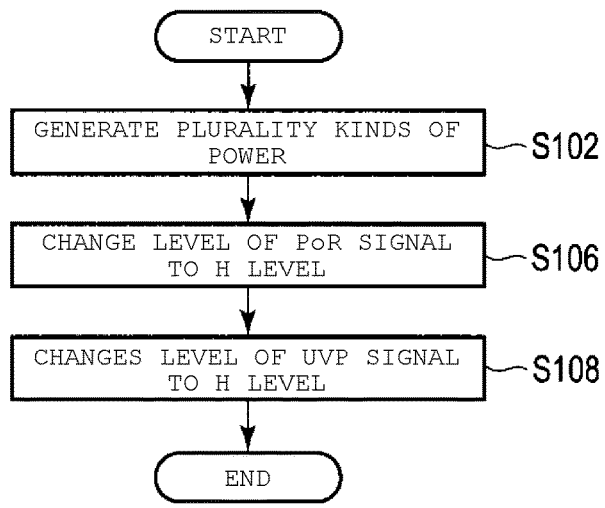

FIG. 9

| CASE | OPERATING SITUATION | FAILURE ANALYSIS DATA 74 ||||||| POWER STATUS ||
|---|---|---|---|---|---|---|---|---|---|
| | | EXTERNAL-POWER SUPPLY STOP COUNTER 60 | PoR COUNTER 64 | UVP COUNTER 66 | SHUTDOWN COUNTER 68 || | EXTERNAL POWER | POWER SUPPLY CIRCUIT 30 |
| | | | | | NUMBER OF PROPER SHUTDOWNS | NUMBER OF IMPROPER SHUTDOWNS | | | |
| 0 | DURING SSD OPERATION | A | B | C | D | E | | | |
| 1 | PROPER SUPPLY STOP OF EXTERNAL POWER | A+1 | B+1 | C | D+1 | E | | PROPER SUPPLY STOP | PROPER STOP |
| 2 | IMPROPER SUPPLY STOP OF EXTERNAL POWER | A+1 | B+1 | C | D | E+1 | | PROPER SUPPLY STOP | PROPER STOP |
| 3 | ABNORMALITY OF POWER SUPPLY CIRCUIT 30 (POWER PD0) | A+1 | B | C | D | E+1 | | IMPROPER SUPPLY STOP | PROPER STOP |
| 4 | ABNORMALITY OF POWER SUPPLY CIRCUIT 30 (OTHER THAN POWER PD0) | A+1 | B+1 | C+1 | D | E+1 | | PROPER SUPPLY STOP | ABNORMAL STOP |

ELECTRONIC DEVICE AND INFORMATION RECORDING METHOD OF ELECTRONIC DEVICE

CROSS-REFERENCE TO RELATED APPLICATION

This application is based upon and claims the benefit of priority from Japanese Patent Application No. 2019-050041, filed Mar. 18, 2019, the entire contents of which are incorporated herein by reference.

FIELD

Embodiments described herein relate generally to an electronic device and an information recording method of the electronic device.

BACKGROUND

There is an electronic device that requires a plurality of kinds of power. Such an electronic device includes a power supply circuit that generates the plurality of kinds of internal power from external power supplied from another device. When the external power is cut off, the electronic device does not operate. Even when the external power is supplied, the electronic device does not operate even when the power supply circuit does not properly generate the plurality of kinds of internal power due to a cause such as a failure of the power supply circuit or the like.

When the electronic device stops operating, it is difficult to specify the cause.

Examples of related art include U.S. Pat. Nos. 9,563,249, 9,778,988, and 9,383,795.

DESCRIPTION OF THE DRAWINGS

FIG. 2 is a block diagram illustrating an example of a configuration of an SSD according to at least one embodiment.

FIG. 3 is a table illustrating an example of failure analysis data according to at least one embodiment.

FIG. 4 is a table illustrating an example of the number-of-shutdowns data according to at least one embodiment.

FIG. 5 is a flowchart illustrating an example of an SSD startup process according to at least one embodiment.

FIG. 9 is a table illustrating an example of failure analysis data in various operating situations of the SSD.

DETAILED DESCRIPTION

Figure 1:
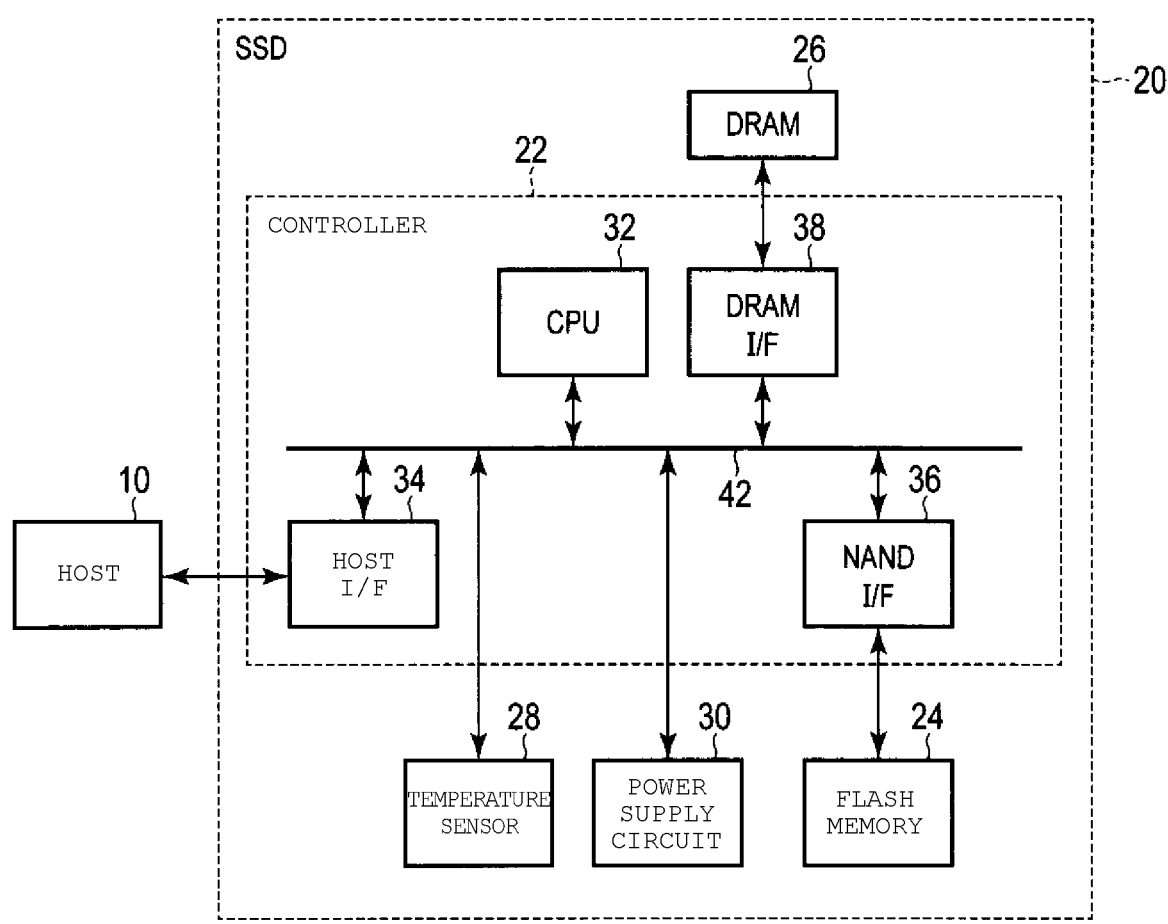
FIG. 1 is a block diagram illustrating an example of a configuration of an information processing system according to at least one embodiment.

At least one embodiment provides an electronic device capable of collecting information that can be used for analysis of a cause of an operation stop and an information recording method of the electronic device.

In general, according to at least one embodiment, there is provided an electronic device including a power supply circuit that generates a plurality of kinds of powers from an external power, a first counter, a second counter, a third counter, a non-volatile memory, and a fourth counter. The first counter counts the number of times that supply of the external power to the power supply circuit is stopped. The second counter is operated by a first power among the plurality powers and counts the number of times that generation of the plurality of kinds of power is stopped. The third counter is operated by the first power and counts the number of times that any of the plurality of kinds of power is dropped to a predetermined voltage or less. The non-volatile memory stores status information indicating whether or not the supply of the external power to the power supply circuit is properly stopped. The fourth counter counts, based on the status information, the number of times that the supply of the external power to the power supply circuit is properly stopped and the number of times that the supply of the external power to the power supply circuit is abnormally stopped.

Hereinafter, at least one embodiment will be described with reference to the drawings. The following description exemplifies a device and a method for embodying technical idea of the embodiment, and the technical idea of at least one embodiment is not limited to a structure, shape, the arrangement, and material of constitutional elements described below. Modifications that can be easily conceived by those skilled in the art are naturally included in the scope of the disclosure. In order to make the description clearer, in the drawings, the size, thickness, planar dimension, shape, and the like of each element may be schematically represented by being changed with respect to an actual embodiment. In a plurality of drawings, elements that differ in their dimensional relationships and proportions may be included. In the plurality of drawings, corresponding elements may be denoted by the same reference numerals and redundant description thereof may be omitted. Although some elements may be given a plurality of designations, examples of these designations are merely examples and do not deny that these elements are given other designations. In addition, it does not deny that another name is given to an element to which a plurality of names are not given. In the following description, "connection" means not only direct connection but also connection via other elements.

The electronic device is not limited to a specific device, but in at least one embodiment, a solid state drive (hereinafter, referred to as an SSD) will be described as an example of the electronic device.

System Configuration

FIG. 1 is a block diagram illustrating an example of the configuration of an information processing system according to at least one embodiment. The information processing system includes a host device (hereinafter, referred to as a host) 10 and an SSD 20. The SSD 20 includes a non-volatile semiconductor memory as a storage unit.

The host 10 is an information processing device that accesses the SSD 20. The host 10 may be a server that stores a large amount of various data in the SSD 20. In this case, the SSD 20 may be connected to the host 10 via a cable or a network. The host 10 may be a personal computer. In this case, the SSD 20 may be embedded in the host 10 or may be connected to the host 10 via a cable or a network.

The SSD 20 includes a controller 22, a flash memory 24, a dynamic random access memory (DRAM) 26, a temperature sensor 28, a power supply circuit 30, and the like. The controller 22 includes a CPU 32, a host interface (host I/F) 34, a NAND interface (NAND I/F) 36, a DRAM interface (DRAM I/F) 38, and the like. The CPU 32, host I/F 34, NAND I/F 36, and DRAM I/F 38 are connected to a bus line 42. The controller 22 may be implemented by a circuit such as a system-on-chip (SoC). The CPU 32 executes firmware stored in the flash memory 24 to implement various functions.

Various standards may be used as the host I/F 34 for electrically interconnecting the host 10 and the SSD 20. For example, the small computer system interface (SCSI) (registered trademark), PCI Express (registered trademark) (also, referred to as PCIe (registered trademark)), serial attached SCSI (SAS) (registered trademark), serial advanced technology attachment (SATA) (registered trademark), non-volatile memory express (NVMe (registered trademark)), universal serial bus (USB) (registered trademark), and universal asynchronous receiver/transmitter (UART) (registered trademark) may be used as the host I/F 34.

The flash memory 24 is an example of a non-volatile semiconductor memory, and is configured by, for example, a NAND flash memory. However, the non-volatile semiconductor memory is not limited to the NAND flash memory, and another non-volatile semiconductor memory such as a NOR flash memory may be used. Although not illustrated, the flash memory 24 may include a plurality of flash memory chips (that is, a plurality of flash memory dies). The flash memory 24 may be configured to be capable of storing one bit or plural bits per memory cell. Read and write of the flash memory 24 are controlled by the controller 22. The flash memory 24 is connected to the NAND I/F 36.

The DRAM 26 as a random access memory (RAM) which is a volatile memory is, for example, a double data rate three low voltage (DDR3L) standard DRAM. The DRAM 26 may be provided with a write buffer, a read buffer, a cache area of a look-up table (LUT), and a storage area of system management information. The write buffer is a buffer area for temporarily storing data to be written to the flash memory 24. The read buffer is a buffer area for temporarily storing data read from the flash memory 24. The cache area of the look-up table (LUT) is an address conversion table (also, referred to as a logical address/physical address conversion table). The storage area of the system management information is for various values, various tables, and the like used during processing of the SSD 20. The LUT is a correspondence table between each logical address and each physical address of the flash memory 24. The DRAM 26 is connected to the DRAM I/F 38. The DRAM 26 may be provided not only outside the controller 22 but also inside the controller 22. In that case, a static random access memory (SRAM) may be used instead of the DRAM 26. The SRAM is a volatile memory that can be accessed faster and is embedded in the controller 22.

The temperature sensor 28 measures temperature of the SSD 20. The output of the temperature sensor 28 is transmitted to the controller 22 according to a serial communication standard, such as an inter-integrated circuit (I2C) standard. The controller 22 controls the power supply circuit 30 according to the output of the temperature sensor 28, and controls generation of a plurality of power supply voltages supplied from the power supply circuit 30 to each device of the SSD 20.

The power supply circuit 30 generates a plurality of kinds of power necessary for each device of the SSD 20 from a single or several external power supplies. In FIG. 1, a power supply line is not illustrated. The power supply circuit 30 may be implemented by a single or several ICs. A control signal for controlling the power supply circuit 30 is transmitted from the controller 22 according to a serial communication standard, for example, the I2C standard. The controller 22 controls the power supply circuit 30 according to a command from the host 10, and controls generation of a plurality of power supply voltages to be supplied from the power supply circuit 30 to each device of the SSD 20.

Configuration of SSD 20

FIG. 2 is a block diagram illustrating an example of the configuration of the SSD according to at least one embodiment. The SSD 20 includes a connector 44 electrically connected to the host 10. The connector 44 is supplied with external power. The external power is, for example, DC 5V or DC 3.3V. The external power is supplied from the connector 44 to the power supply circuit 30 through a fuse 46 and a load switch 48 in series.

The fuse 46 is melted when the external power is a predetermined voltage or higher. Thereafter, the external power is not supplied to the load switch 48 unless the fuse 46 is replaced. The load switch 48 is an on/off switch, and is in an on state properly. In the on state, the load switch 48 outputs the supplied external power. When the external power is a predetermined voltage or higher, the load switch 48 is turned to an off state. In the off state, the load switch 48 does not output the external power, that is, outputs 0V. A constant voltage at which the fuse 46 is melted may be higher or lower than a constant voltage at which the load switch 48 changes from the on state to the off state, or may be the same. The fuse 46 and the load switch 48 doubly prevent the overcurrent from being supplied to the power supply circuit 30.

The power supply circuit 30 is supplied with external power (hereinafter, the external power is DC 3.3V) output from the load switch 48. The power supply circuit 30 includes low dropouts (LDOs) 52 and 54, DC/DC converters 56 and 58, external-power supply stop counter 60, and a power on reset (PoR)/under voltage protection (UVP) signal generator 62.

The LDOs 52 and 54 are circuits that output power for devices requiring a small current. The DC/DC converters 56 and 58 are circuits that output power for devices requiring a large current. The LDOs 52 and 54 and the DC/DC converters 56 and 58 may be implemented by individual ICs or may be implemented by a single IC. The single IC may be referred to as a power management IC (PMIC) in some cases. The external-power supply stop counter 60 and the PoR/UVP signal generator 62 may be provided in the PMIC.

Both the LDOs 52 and 54 and the DC/DC converters 56 and 58 lowers the external power or use the external power as they are to generate a plurality of kinds of power required by each device in the SSD 20.

For example, the LDO 52 generates a 3.3V power using the external power as it is. The 3.3V power is supplied to controller 22 and temperature sensor 28. For example, the LDO 54 lowers the external power to generate a 2.5V power. The 2.5V power is supplied to the controller 22. For example, the DC/DC converter 58 lowers the external power to generate a 2.8V power supply. The 2.8V power is supplied to the flash memory 24.

For example, the DC/DC converter 56 lowers the external power to generate three channels of power PD0, PD1, and PD2 of 1.35V, 1.8V, 1.0V. The 1.35V power is supplied to the DRAM 26. The 1.8V power is supplied to the flash memory 24. Three channels of power PD0, PD1, and PD2 of 1.0V are supplied to various parts of the controller 22. The DC/DC converter 56 may not generate the power PD0, PD1 or PD2 depending on a power state of the SSD 20. For example, when the power state is a power saving mode, the DC/DC converter 56 does not generate the power supplies PD2 and PD1, but generates the power PD0. The power state of the SSD 20 is determined by a mode designation signal received from the outside. An I2C bus is also connected between the temperature sensor 28 and the controller 22.

The external-power supply stop counter 60 determines whether or not supply of the external power to the power supply circuit 30 is stopped and counts the number of times that the external power is stopped. A count value of the external-power supply stop counter 60 is transmitted to the controller 22.

The PoR/UVP signal generator 62 outputs a PoR signal and a UVP signal. In an initial state, the levels of the PoR signal and the UVP signal are an L level. The power supply circuit 30 generates a plurality of kinds of power when the external power is supplied. When the power supply circuit 30 properly generates all of the plurality of kinds of power, the PoR/UVP signal generator 62 changes the level of the PoR signal from the L level to an H level, and changes the level of the UVP signal from the L level to the H level.

After the power supply circuit 30 properly generates all of the plurality of kinds of power, when the voltage of any of the power supplies drops to a predetermined rate, for example, 60% or less, the PoR/UVP signal generator 62 changes the level of the UVP signal from the H level to the L level. When the external power is cut off, the PoR/UVP signal generator 62 changes the level of the PoR signal from the H level to the L level. When the level of the PoR signal is changed from the H level to the L level, the power supply circuit 30 is stopped. The PoR signal and the UVP signal output from the PoR/UVP signal generator 62 are transmitted to the controller 22.

The controller 22 includes a PoR counter 64, a UVP counter 66, and a shutdown counter 68. The PoR counter 64 counts PoR signals. The UVP counter 66 counts the UVP signal. The PoR counter 64, the UVP counter 66, and the shutdown counter 68 are realized by the CPU 32 in the controller 22 executing firmware. Alternatively, the PoR counter 64, the UVP counter 66, and the shutdown counter 68 may be realized by separate hardware. The PoR counter 64 increments the count value by one when the level of the PoR signal is changed from the H level to the L level. The UVP counter 66 increments the count value by one when the level of the UVP signal is changed from the H level to the L level. The PoR counter 64 and the UVP counter 66 are operated by the power PD0.

The shutdown counter 68 counts the number of times of shutdown of the SSD 20. The shutdown of the SSD 20 includes a proper shutdown that has undergone proper processing based on a command from the host 10 and an improper shutdown that has not undergone proper processing. The improper shutdown includes stopping the supply of external power to the SSD 20 by the user operating a power button, stopping the supply of external power to the SSD 20 by the user pulling out a power outlet, stop of the external power to the SSD 20 due to a power failure, operation stop of the power supply circuit 30 due to a failure, and the like.

In the case of the proper shutdown, the host 10 issues a command to notify the SSD 20 of the shutdown before stopping the supply of the external power to the SSD 20. When the command is received, the controller 22 performs necessary processing before shutdown. For example, when the data to be written to the flash memory 24 is not yet written to the flash memory 24 and remains in the write buffer in the DRAM 26, the data in the write buffer is written to the flash memory 24. When this writing is ended, the controller 22 transmits a preprocessing completion notification to the host 10. When the host 10 receives the preprocessing completion notification from the SSD 20, the host 10 stops the supply of the external power to the SSD 20.

In the case of improper shutdown, a notification command of shutdown is not issued from the host 10 to the SSD 20, and the SSD 20 does not execute pre-processing, and the supply of external power to the power supply circuit 30 is stopped.

When the SATA standard is used as the host I/F 34, the host 10 issues a flush cache command and a standby immediate command to the SSD 20 before the host 10 shuts down the SSD 20. When execution of these commands is completed, the SSD notifies the host 10 of the completion. When this notification is received, the host 10 stops the supply of external power to the SSD 20.

When the PCIe standard or NVMe standard is used as the host I/F 34, the host 10 deletes all I/O commands and sets shutdown notification before the host 10 shuts down the SSD 20, and the SSD 20 executes a shutdown process. When the execution of the shutdown process is completed, the SSD 20 notifies the host 10 of the completion. When this notification is received, the host 10 stops the supply of external power to the SSD 20.

The controller 22 writes log data 72 indicating an operation log such as a reception history of the command from the host 10 and an execution history of the command into the flash memory 24 as needed. When the power supply circuit 30 starts generation of a plurality of kinds of power by the supply of external power, that is, when the SSD 20 is started, the controller 22 can determine whether or not the previous shutdown was a proper shutdown by referring to the log data 72 at the time of the previous shutdown stored in the flash memory 24. For example, when the log data 72 does not indicate the reception history of the command from the host 10 or the execution history of the command, it is determined that the previous shutdown was an improper shutdown.

The controller 22 transmits the determination result to the shutdown counter 68. The shutdown counter 68 increments the count value of the number of proper shutdowns by 1 when the previous shutdown is a proper shutdown and increments the count value of the number of improper shutdowns by 1 when the previous shutdown was an improper shutdown, according to the determination result, at the startup of SSD 20.

The controller 22 writes the count value of the PoR counter 64, the count value of the UVP counter 66, the count value (the number of proper shutdowns and the number of improper shutdowns) of the shutdown counter 68 and the count value of the external-power supply stop counter 60 transmitted from the power supply circuit 30 into the flash memory 24 as failure analysis data 74.

FIG. 3 is a table illustrating an example of failure analysis data according to the embodiment. The failure analysis data 74 includes the count value of the external-power supply stop counter 60, the count value of the PoR counter 64, the count value of the UVP counter 66, the count value of the shutdown counter 68, and the power status. The failure analysis data 74 includes data at the previous startup (time $t_{i-1}$), in addition to data at the current time (time $t_i$).

The controller 22 specifies the power status based on the failure analysis data 74 of these two times at the startup of the SSD 20. The power status indicates the cause of the shutdown of the SSD 20. For example, the controller 22 specifies the power status according to which counter count value is incremented. The power status includes proper supply stop of the external power, improper supply stop of the external power, proper stop of the power supply circuit 30, and abnormal stop of the power supply circuit 30. The controller 22 also includes this power status to the failure analysis data 74 and writes the failure analysis data 74 into the flash memory 24.

Furthermore, the controller 22 writes the number-of-shutdowns data 76 in which the count value of the shutdown counter 68 is accumulated for each power status into the flash memory 24.

FIG. 4 is a table illustrating an example of the number-of-shutdowns data 76 according to at least one embodiment. The number-of-shutdowns data 76 indicates a cumulative value of the number of shutdowns caused by the proper supply stop of the external power, the number of shutdowns caused by the improper supply stop of the external power, the number of shutdowns caused by the proper operation stop of the power supply circuit 30, and the number of shutdowns caused by abnormal operation stop of the power supply circuit 30.

Operation Example of SSD 20

Hereinafter, an example of the operation of the SSD 20 according to at least one embodiment will be described with reference to the flowcharts of FIG. 5, FIG. 6, and FIG. 7.

FIG. 5 is a flowchart illustrating a startup process of the SSD 20 according to at least one embodiment.

When the external power is supplied, the power supply circuit 30 starts operating, and the power supply circuit 30 generates a plurality of kinds of power based on the external power (S102). The PoR/UVP signal generator 62 monitors voltages of the plurality of kinds of power supplied from the power supply circuit 30, and determines whether or not all of the plurality of kinds of power are properly generated.

When it is determined that all of the plurality of kinds of power are properly generated, the PoR/UVP signal generator 62 changes the PoR signal from the L level to the H level (S106). When it is determined that all of the plurality of kinds of power are properly generated, the PoR/UVP signal generator 62 changes the UVP signal from the L level to the H level (S108). When both S106 and S108 are performed, the PoR/UVP signal generator 62 ends the process. With this configuration, a series of processes in FIG. 5 end (end).

Figure 6:
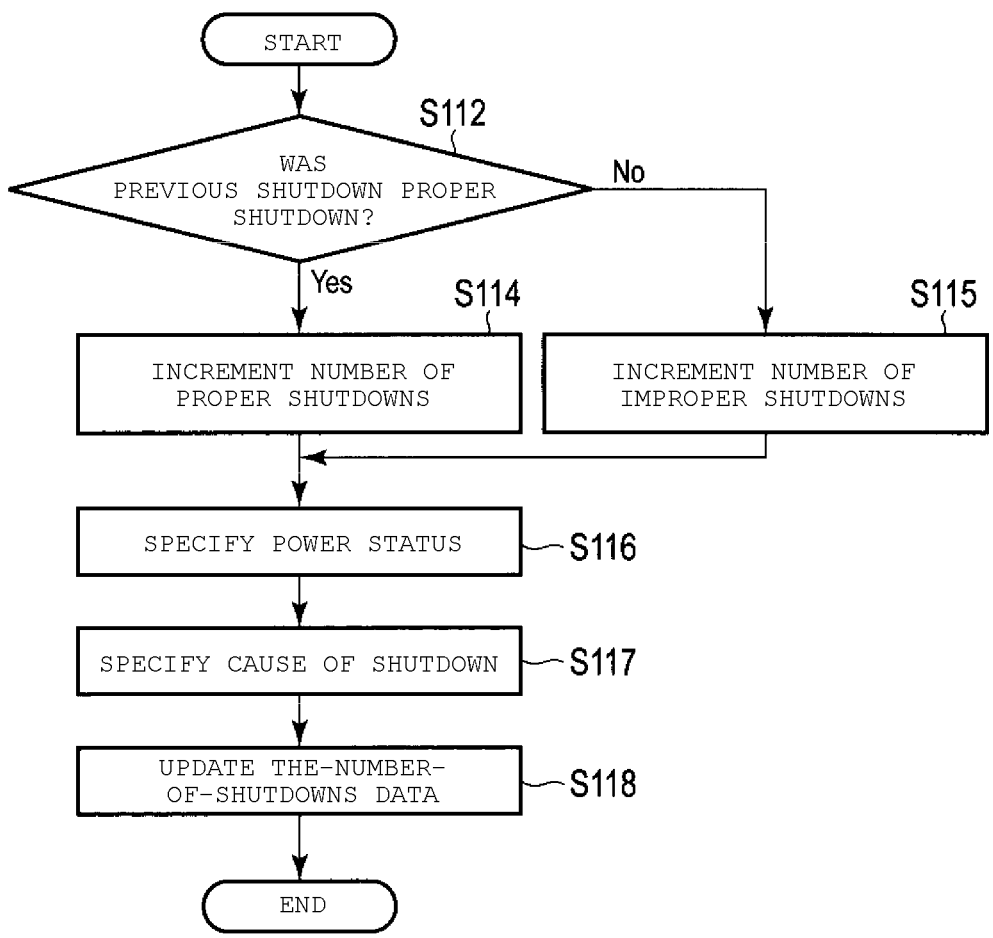
FIG. 6 is a flowchart illustrating an example of a recording process of failure analysis data of the SSD according to at least one embodiment.

FIG. 6 is a flowchart illustrating a recording process of failure analysis data of the SSD 20 according to at least one embodiment.

The controller 22 reads the log data 72 in the flash memory 24 and determines whether or not the previous shutdown was a proper shutdown based on the read log data (S112).

When it is determined that the previous shutdown was a proper shutdown (when the determination result in S112 is Yes), the controller 22 increments the count value of the number of proper shutdowns of the shutdown counter 68 by 1 and writes the count value of the shutdown counter 68 into the failure analysis data 74 in the flash memory 24 (S114).

When it is determined that the previous shutdown was not a proper shutdown (when the determination result in S112 is No), the controller 22 increments the count value of the number of improper shutdowns of the shutdown counter 68 by 1 and writes the count value of the shutdown counter 68 into the failure analysis data 74 in the flash memory 24 (S115).

After S114 or S115, the controller 22 specifies the power status based on the current failure analysis data 74 and the failure analysis data 74 at the previous startup and writes the specified power status into the failure analysis data 74 in the flash memory 24 (S116). Based on the count value of the shutdown counter 68 and the power status specified in S116, the controller 22 determines whether the cause of the previous shutdown is the proper supply stop of the external power, the improper supply stop of the external power, the proper operation stop of the power supply circuit 30, or the abnormal operation stop of the power supply circuit 30 (S117). The controller 22 updates the number-of-shutdowns data 76 based on the cause of the shutdown specified in S117 (S118), and ends a series of processes in FIG. 6 (END).

Since the number-of-shutdowns data 76 is a cumulative value for each cause of shutdown, failure analysis of the SSD 20 can be performed based on the number-of-shutdowns data 76 when the SSD 20 fails. For that reason, if the number-of-shutdowns data 76 can be read, the SSD 20 according to at least one embodiment can read without interruption for failure analysis.

Figure 7:
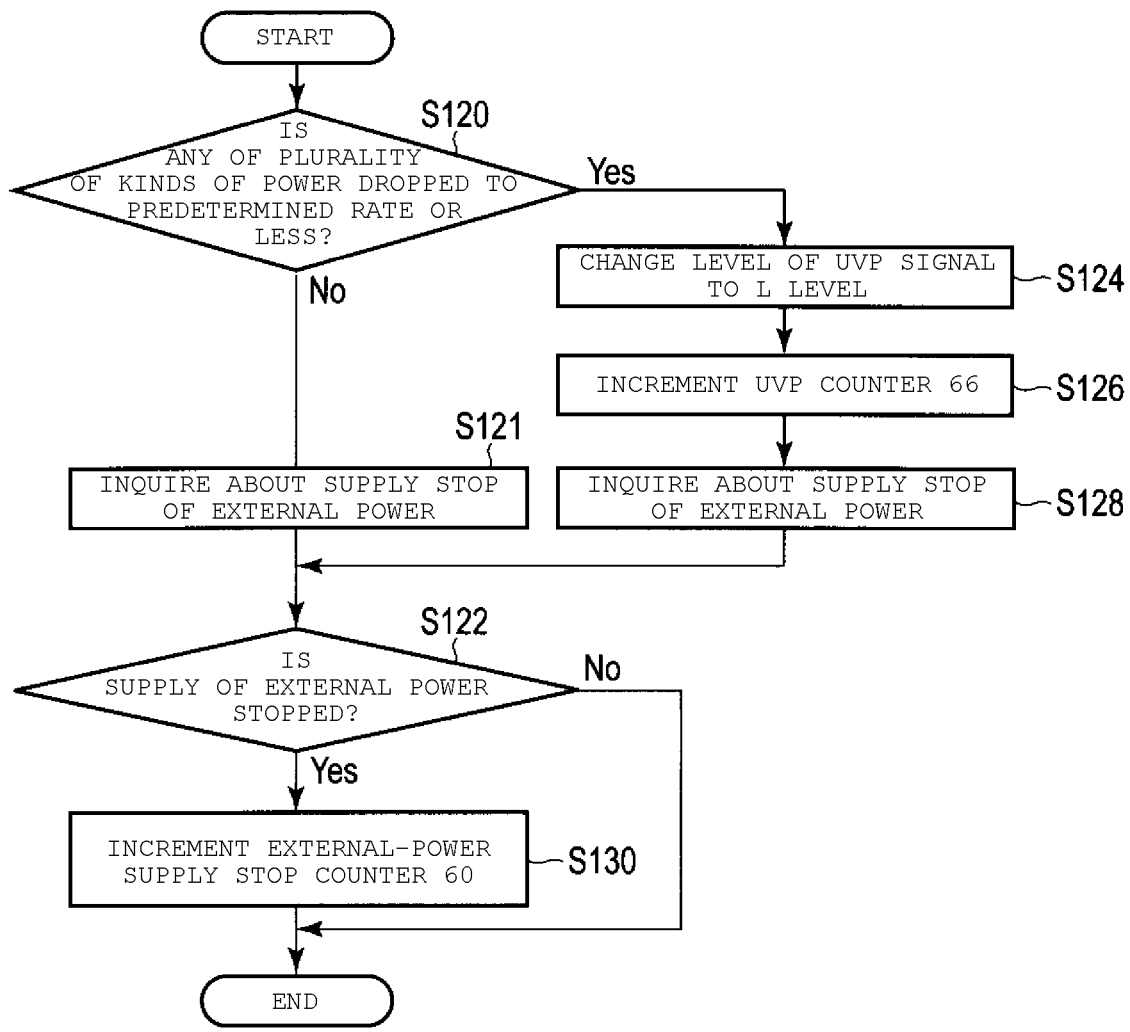
FIG. 7 is a flowchart illustrating another example of the recording process of failure analysis data of the SSD according to at least one embodiment.

FIG. 7 is a flowchart illustrating an example of a recording process of failure analysis data of the SSD 20 according to at least one embodiment.

The PoR/UVP signal generator 62 determines whether or not a voltage of any of the plurality of kinds of power generated by the power supply circuit 30 is dropped to a predetermined rate or less (S120).

When it is determined that the voltage of any of the plurality of kinds of power has not dropped to the predetermined rate or less (when the determination result in S120 is No), the PoR/UVP signal generator 62 transmits a signal to query whether or not the supply of the external power is stopped to the external-power supply stop counter 60 (S121). When the signal of S121 or S128 is received, the external-power supply stop counter 60 determines whether or not the supply of the external power is stopped (S122).

When it is determined that the supply of the external power is not stopped (when the determination result in S122 is No), a series of processes of FIG. 7 ends (END).

When it is determined that the voltage of any of the plurality of kinds of power is dropped to the predetermined rate or less (when the determination result in S118 is Yes), the PoR/UVP signal generator 62 changes the UVP signal from the H level to the L level (S124). With this configuration, the controller 22 increments the count value of the UVP counter 66 by 1 (S126), and writes the count value of the UVP counter 66 into the failure analysis data 74 in the flash memory 24. After the process of S126, the controller 22 transmits a signal to query whether or not the external power is stopped to the external-power supply stop counter 60 (S128).

When it is determined that the supply of the external power is stopped (when the determination result in S122 is Yes), the external-power supply stop counter 60 increments the count value by 1 (S130), and transmits the count value to the controller 22. When the count value is received, the controller 22 writes the count value of the external-power supply stop counter 60 into the failure analysis data 74 in the flash memory 24. When the process of S130 is completed, a series of processes in FIG. 7 end (END).

Figure 8:
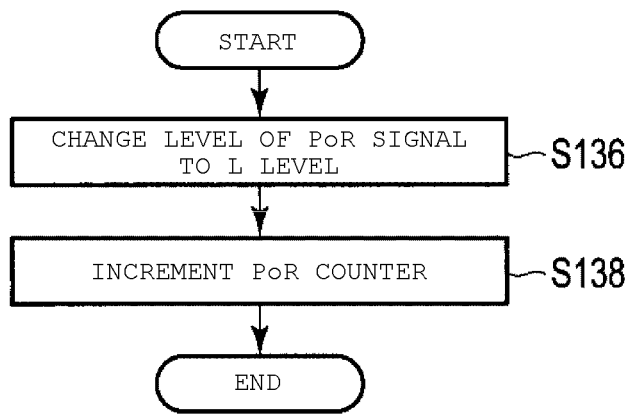
FIG. 8 is a flowchart illustrating an example of an operation when supply of the external power of the SSD according to at least one embodiment is stopped.

FIG. 8 is a flowchart illustrating an example of the operation when the supply of the external power of the SSD 20 according to at least one embodiment is stopped.

When the supply of the external power is stopped, the power supply circuit 30 stops generation of the plurality of kinds of power. When it is determined that generation of all of the plurality of kinds of power is stopped, the PoR/UVP signal generator 62 changes the level of the PoR signal from the H level to the L level (S136). With this configuration, the controller 22 increments the count value of the PoR counter 64 by 1 (S138), and writes the count value of the PoR counter 64 into the failure analysis data 74 in the flash memory 24. When the process of S138 is completed, a series of processes in FIG. 8 end (END).

Failure Analysis Data

FIG. 9 illustrates an example of the failure analysis data 74 in various operating situations (Cases 0 to 4) of the SSD 20. The shutdown counter 68 is updated at the next startup after shutdown. FIG. 9 illustrates the failure analysis data 74 after the update of the shutdown counter 68 at the startup.

Case 0 is a situation in which the SSD 20 operates properly. In Case 0, it is assumed that the count value of the external-power supply stop counter 60 is "A", the count value of the PoR counter 64 is "B", the count value of the UVP counter 66 is "C", the count value (the number of proper shutdowns) of the shutdown counter 68 is "D", and the count value (the number of improper shutdowns) of the shutdown counter 68 is "E". The power status indicates that the supply of the external power is properly stopped and the power supply circuit 30 is properly stopped operating. The "A", "B", "C", "D", and "E" are predetermined positive integers. The failure analysis data 74 in Case 0 is stored in the flash memory 24 as the failure analysis data 74 at time $t_{i-1}$ illustrated in FIG. 3, for example.

Case 1 is a situation in which the supply of the external power is properly stopped and the SSD 20 is started-up after the operation of the power supply circuit 30 is properly stopped. Case 2 is a situation in which the supply of the external power is improperly stopped and the SSD 20 is started-up after the operation of the power supply circuit 30 is properly stopped. The difference between Case 1 and Case 2 is whether the external power stop is caused by a proper shutdown (Case 1) by the host 10 or an improper power supply stop (Case 2).

Figure 10:
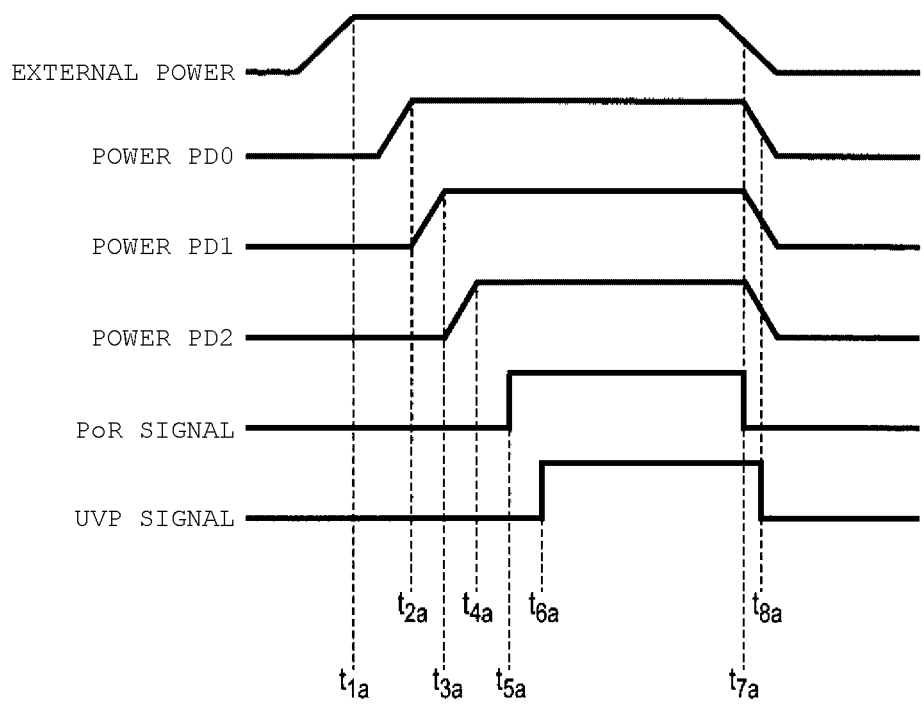
FIG. 10 is a diagram illustrating an example of input and output signal waveforms of the power supply circuit in a certain operating situation.

FIG. 10 illustrates an example of waveforms of input and output signals of the power supply circuit 30 in Case 1 and Case 2.

Although the power supply circuit 30 outputs eight channels of power, for convenience of explanation, FIG. 10 illustrates only three channels of power PD0, PD1, and PD3. Power of the other channel has, for example, the same waveform as the power PD1 or PD2.

When the host 10 starts supplying the external power to the SSD 20, the voltage of the external power increases to a predetermined value. When a voltage of the external power increases to the predetermined value (time $t_{1a}$), the external power is supplied to the power supply circuit 30. When the external power is supplied to the power supply circuit 30, the power supply circuit 30 generates a plurality of kinds of power. For example, the power supply circuit 30 generates power PD0 (time $t_{2a}$), generates power PD1 (time $t_{3a}$), and generates power PD2 (time $t_{4a}$). The order in which the power supply circuit 30 generates the power is an example. The power supply circuit 30 can simultaneously generate a plurality of kinds of power.

When the power supply circuit 30 generates power for all the channels (time $t_{5a}$), the PoR/UVP signal generator 62 changes a level of the PoR signal from a L level to a H level, and changes the level of the UVP signal from the L level to the H level (at time $t_{6a}$).

In Case 1, the host 10 notifies the SSD 20 before shutdown. When the SSD 20 prepares for shutdown and returns the completion of preparation to the host 10, the host 10 properly stops the supply of external power to the power supply circuit 30, and the SSD 20 is properly shut down. In Case 2, the external power is stopped and the SSD 20 is shut down (that is, improperly) while the process described above is not completed.

In both Case 1 and Case 2, when the voltage of the external power drops to the predetermined voltage or less (time $t_{7a}$), the PoR/UVP signal generator 62 changes the level of the PoR signal from the H level to the L level. Thereafter, the power supply circuit 30 stops generation of the power (PD0, PD1, and PD2). When the voltage of any of the power supplies drops to the predetermined rate or less (time $t_{8a}$), the PoR/UVP signal generator 62 changes the level of the UVP signal from the H level to the L level.

Power for the PoR counter 64 and the UVP counter 66 is the power PD0. At time $t_{7a}$ when the PoR signal changes from the H level to the L level, the power PD0 is generated and thus, the PoR counter 64 increments the count value. However, at time $t_{8a}$ when the UVP signal changes from the H level to the L level, a voltage of the power PD0 is dropped to a predetermined rate and thus, the UVP counter 66 does not increment the count value. The external-power supply stop counter 60 increments the count value by 1 at time $t_{7a}$ when the voltage of the external power drops to the predetermined voltage or less, and transmits the count value to the controller 22. When the count value is received, the controller 22 writes the count value of the external-power supply stop counter 60 into the failure analysis data 74 in the flash memory 24.

As illustrated in FIG. 9, in Case 1, the count value of the external-power supply stop counter 60 is "A+1", the count value of the PoR counter 64 is "B+1", the count value of the UVP counter 66 remains "C", the count value of the shutdown counter 68 (the number of proper shutdowns) is "D+1", and the count value of the shutdown counter 68 (the number of improper shutdowns) remains "E". The failure analysis data 74 of Case 1 is stored in the flash memory 24 as failure analysis data 74 at time $t_i$ illustrated in FIG. 3, for example.

As illustrated in FIG. 9, in Case 2, the count value of the external-power supply stop counter 60 is "A+1", the count value of the PoR counter 64 is "B+1", the count value of the UVP counter 66 remains "C", the count value (the number of proper shutdowns) of the shutdown counter 68 remains "D", and the count value of the shutdown counter 68 (the number of improper shutdowns) is "E+1". The failure analysis data 74 in Case 2 is stored in the flash memory 24 as data of time $t_i$ illustrated in FIG. 3, for example.

Cases 3 and 4 are situations where the external power is properly stopped and the operation of the power supply circuit 30 is abnormally stopped due to a failure or the like. The difference between Case 3 and Case 4 is whether the power supply that is not properly generated from the power supply circuit 30 is PD0 (Case 3) or other than PD0 (Case 4).

Figure 11:
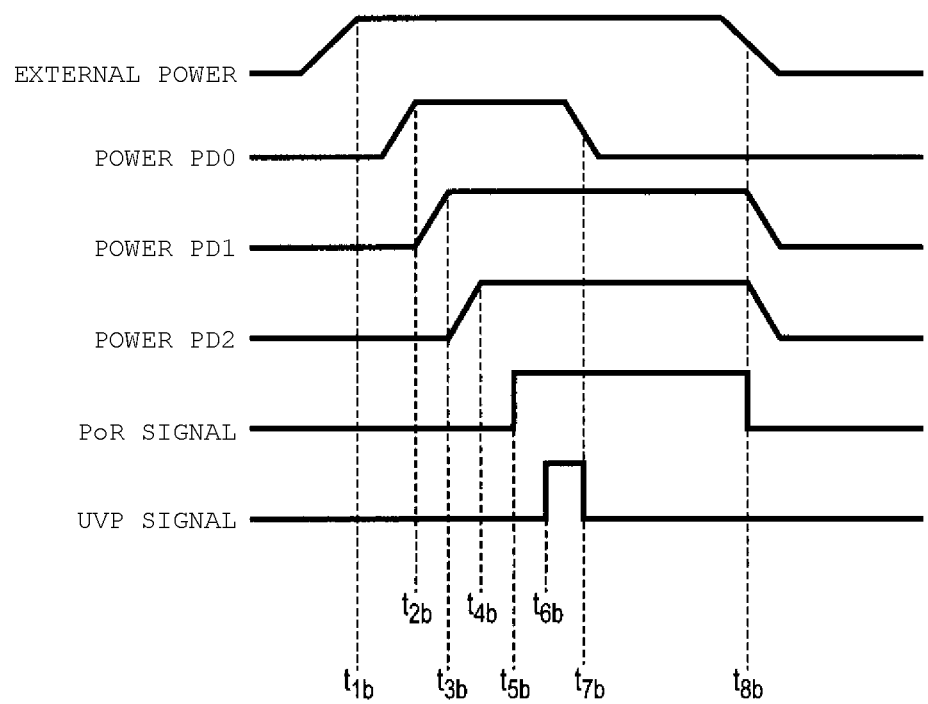
FIG. 11 is a diagram illustrating an example of input and output signal waveforms of the power supply circuit in another operating situation.

FIG. 11 illustrates an example of waveforms of input and output signals of the power supply circuit 30 in Case 3.

When the host 10 starts supplying the external power to the SSD 20, the voltage of the external power increases to a predetermined value. When the voltage of the external power increases to the predetermined value (time $t_{1b}$), the external power is supplied to the power supply circuit 30. When the external power is supplied to the power supply circuit 30, the power supply circuit 30 generates a plurality of kinds of power. For example, the power supply circuit 30 generates the power PD0 (time $t_{2b}$), generates the power PD1 (time $t_{3b}$), and generates the power PD2 (time $t_{4b}$). The order in which the power supply circuit 30 generates the power is an example. Also, the power supply circuit 30 can simultaneously generate the plurality of kinds of power.

When the power supply circuit 30 generates power for all channels (time $t_{5b}$), the PoR/UVP signal generator 62 changes the level of the PoR signal from the L level to the H level, and changes the level of the UVP signal from L level to the H level (at time $t_{6b}$).

In Case 3, the power supply circuit 30 performs an abnormal operation during the operation of the SSD 20, and the power PD0 drops. When the voltage of the power PD0 drops to the predetermined rate or less, the PoR/UVP signal generator 62 changes the level of the UVP signal from the H level to the L level (time $t_{7b}$).

When proper shutdown is performed and the voltage of the external power drops to the predetermined voltage or less, the PoR/UVP signal generator 62 changes the level of the PoR signal from the H level to the L level (time $t_{8b}$). When the level of the PoR signal changes from the H level to the L level, the power supply circuit 30 stops generation of the power PD1 and PD2.

Power for the PoR counter 64 and the UVP counter 66 is the power PD0. At time $t_{7b}$ when the UVP signal changes from the H level to the L level, the voltage of the power PD0 is dropped to a predetermined rate and thus, the UVP counter 66 does not increment the count value. At time $t_{8b}$ when the PoR signal changes from the H level to the L level, the power PD0 is not generated and thus, the PoR counter 64 does not increment the count value. The external-power supply stop counter 60 increments the count value by 1 at time $t_{8b}$ when the voltage of the external power drops to the predetermined voltage or less, and transmits the count value to the controller 22. When the count value is received, the controller 22 writes the count value of the external-power supply stop counter 60 into the failure analysis data 74 in the flash memory 24.

As illustrated in FIG. 9, in Case 3, the count value of the external-power supply stop counter 60 is "A+1", the count value of the PoR counter 64 remains "B", the count value of the UVP counter 66 remains "C", the count value of the shutdown counter 68 (the number of proper shutdowns) remains "D", and the count value of the shutdown counter 68 (the number of improper shutdowns) is "E+1". The failure analysis data 74 of Case 3 is stored in the flash memory 24 as failure analysis data 74 at time $t_i$ illustrated in FIG. 3, for example.

Figure 12:
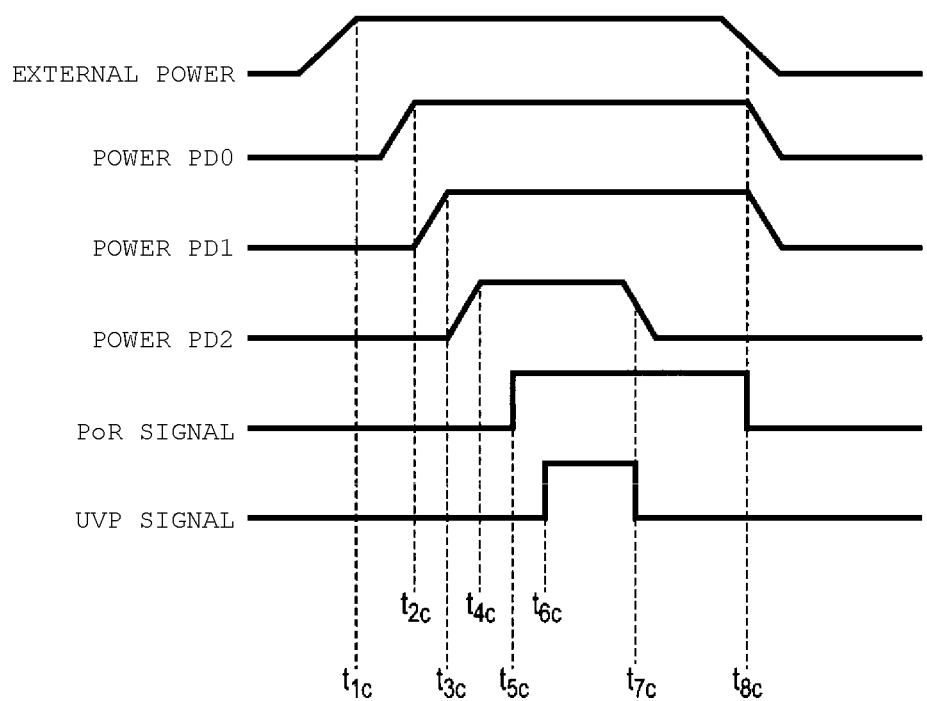
FIG. 12 is a diagram illustrating an example of input and output signal waveforms of the power supply circuit in still another operating situation.

FIG. 12 illustrates an example of waveforms of input and output signals of the power supply circuit 30 in Case 4.

When the host 10 starts to operate the external power, the voltage of the external power increases to a predetermined voltage (time $t_{1c}$), and the external power is supplied to the power supply circuit 30, the power supply circuit 30 also starts an operation to generate a plurality of kinds of power. For example, the voltage of the power PD0 increases to a predetermined voltage (time $t_{2c}$), a voltage of the power PD1 increases to a predetermined voltage (time $t_{1c}$), and a voltage of the power PD2 increases to a predetermined voltage (time $t_{4c}$). The order in which the power supply circuit 30 generates power is an example. The power supply circuit 30 can simultaneously generate a plurality of kinds of power.

When power for all the channels of the power supply circuit 30 is generated (time $t_{5c}$), the PoR/UVP signal generator 62 changes the level of the PoR signal from the L level to the H level, and changes the level of the UVP signal from the L level to the H level (time $t_{6c}$).

In Case 4, the power supply circuit 30 performs an abnormal operation during the operation of the SSD 20, and the power supply other than the power PD0, for example, PD2 is dropped. When the voltage of the power PD2 drops to the predetermined rate or less (time $t_{7c}$), the PoR/UVP signal generator 62 changes the level of the UVP signal from the H level to the L level.

Thereafter, the proper shutdown is performed, and when the voltage of the external power drops to the predetermined voltage or less (time $t_{8c}$), the PoR/UVP signal generator 62 changes the level of the PoR signal from the H level to the L level. Thereafter, the power supply circuit 30 stops the generation of the power (PD0, PD1, and PD2).

The power supply of the PoR counter 64 and the UVP counter 66 is the power PD0. At time $t_{7c}$ when the UVP signal changes from the H level to the L level, the power PD0 is properly generated and thus, the UVP counter 66 increments the count value. Even at time $t_{8c}$ when the PoR signal changes from the H level to the L level, the power PD0 is properly generated and thus, the PoR counter 64 increments the count value. The external-power supply stop counter 60 increments the count value by 1 at time $t_{8c}$ when the voltage of the external power drops to the predetermined voltage or less, and transmits the count value to the controller 22. When the count value is received, the controller 22 writes the count value of the external-power supply stop counter 60 into the failure analysis data 74 in the flash memory 24.

As illustrated in FIG. 9, in Case 4, the count value of the external-power supply stop counter 60 is "A+1", the count value of the PoR counter 64 is "B+1", the count value of the UVP counter 66 is "C+1", the count value (the number of proper shutdowns) of the shutdown counter 68 remains "D", and the count value (the number of improper shutdowns) of the shutdown counter 68 is "E+1". The failure analysis data 74 in Case 4 is stored in the flash memory 24 as the failure analysis data 74 at time $t_i$ illustrated in FIG. 3, for example.

As illustrated in FIG. 9, the count value of the external-power supply stop counter 60, the count value of the PoR counter 64, the count value of the UVP counter 66, the number of proper shutdowns and the number of improper shutdowns of the shutdown counter 68 included in the failure analysis data 74 of Case 1 to Case 4 in which the SSD 20 stops operating change with respect to the count value/the number of shutdowns included in the failure analysis data 74 of Case 0 at which the SSD 20 operates properly. Then, which count value/the number of shutdowns changes depends on Case 1 to Case 4. For that reason, the controller 22 can specify the cause of the previous shutdown of the SSD 20 by comparing the count values included in the failure analysis data 74 at the startup of the SSD 20 with the count values included in the failure analysis data 74 in Case 0 and examining which count value has changed.

For example, as a result of comparing the count values included in the failure analysis data 74 at the startup of the SSD 20 with the count values included in the failure analysis data 74 in Case 0, when it is determined that the count value of the external-power supply stop counter 60 changes from "A" to "A+1", the count value of the PoR counter 64 changes from "B" to "B+1", the count value of the UVP counter 66 remains "C", the number of proper shutdowns of the shutdown counter 68 changes from "D" to "D+1", and the number of improper shutdowns of the shutdown counter 68 remains "E", the controller 22 can determine that the cause of the previous shutdown is the proper supply stop of the external power (Case 1). In this case, the controller 22 writes power status data indicating that the supply of the external power is properly stopped and the power supply circuit 30 is properly stopped operating into the failure analysis data 74.

As a result of comparing the count values included in the failure analysis data 74 at the startup of the SSD 20 with the count values included in the failure analysis data 74 in Case 0, when it is determined that the count value of the external-power supply stop counter 60 changes from "A" to "A+1", the count value of the PoR counter 64 changes from "B" to "B+1", the count value of the UVP counter 66 remains "C", the number of proper shutdowns of the shutdown counter 68 remains "D", and the number of improper shutdowns of the shutdown counter 68 changes from "E" to "E+1", the controller 22 can determine that the cause of the previous shutdown is the improper supply stop of external power (Case 2). In this case, the controller 22 writes power status data indicating that the supply of the external power is improperly stopped and the power supply circuit 30 is properly shut down into the failure analysis data 74.

As a result of comparing the count values included in the failure analysis data 74 at the startup of the SSD 20 with the count values included in the failure analysis data 74 in Case 0, when it is determined that the count value of the external-power supply stop counter 60 changes from "A" to "A+1", the count value of the PoR counter 64 remains "B", the count value of the UVP counter 66 remains "C", the number of proper shutdowns of the shutdown counter 68 remains "D", and the number of improper shutdowns of the shutdown counter 68 changes from "E" to "E+1", the controller 22 can determine that the cause of the previous shutdown is the abnormal stop of the power PD0 of the power supply circuit 30 (Case 3). In this case, the controller 22 writes the power status data indicating that the supply of the external power is properly stopped and the supply of power PD0 of the power supply circuit 30 is abnormally stopped into the failure analysis data 74.

As a result of comparing the count values included in the failure analysis data 74 at the startup of the SSD 20 with the count values included in the failure analysis data 74 in Case 0, when it is determined that the count value of the external-power supply stop counter 60 changes from "A" to "A+1", the count value of the PoR counter 64 changes from "B" to "B+1", the count value of the UVP counter 66 changes from "C" to "C+1", the number of proper shutdowns of the shutdown counter 68 remains "D", and the number of improper shutdowns of the shutdown counter 68 changes from "E" to "E+1", the controller 22 can determine that the cause of the previous shutdown is the abnormal stop of the power other than the power PD0 of the power supply circuit 30 (Case 4). In this case, the controller 22 writes the power status data indicating that the supply of the external power is properly stopped and the supply of power other than the power PD0 of the power supply circuit 30 is abnormally stopped into the failure analysis data 74.

Although the PoR counter 64 and the UVP counter 66 are operated by the power PD0, if the second, third, . . . PoR counters and the UVP counter, which are operated by the other power supplies PD1 and PD2 are further provided, it is possible to determine whether each power is proper or abnormal.

According to at least one embodiment, the controller 22 specifies, at the startup of the SSD 20, whether the cause of the previous shutdown is the proper supply stop of the external power, the improper supply stop of the external power, the proper operation stop of the power supply circuit 30, the abnormal operation stop of the power supply circuit 30. The controller 22 also updates the number-of-shutdowns data 76 based on the specified cause of shutdown. When the SSD 20 fails, failure analysis can be performed by referring to the number-of-shutdowns data 76. In the related art, it was difficult to specify the cause of abnormal shutdown if the environment (host or external power supply) where SSD 20 was used as well as SSD 20 itself was not at hand.

Furthermore, according to at least one embodiment, since the cause of the shutdown is determined using the counter operated by the specific power of the power supply circuit 30, when the operation of the power supply circuit 30 is not normal, it is possible to determine whether or not the generation of a specific power is properly generated, and whether or not generation of a power other than the specific power is properly generated.

The present disclosure is not limited to the embodiment described above as it is, and at an implementation stage, the constituent elements can be modified and embodied without departing from the scope of the invention. Various inventions can be formed by appropriate combinations of a plurality of constitutional elements disclosed in the embodiment. For example, some constitutional elements may be deleted from all the constitutional elements indicated in the embodiment.

Furthermore, constitutional elements in different embodiments may be combined as appropriate. For example, although the SSD has been described as an example of an electronic device, the electronic device is not limited to a specific electronic device as long as it includes a power supply circuit that generates a plurality of kinds of powers from an external power.

While certain embodiments have been described, these embodiments have been presented byway of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a power supply circuit configured to generate a plurality of kinds of powers from an external power;
   a first counter configured to count the number of times that supply of the external power to the power supply circuit is stopped;
   a second counter configured to be operated by a first power among the plurality of powers and to count the number of times that generation of the plurality of kinds of power is stopped;
   a third counter configured to be operated by the first power and to count the number of times that any of the plurality of kinds of power is dropped to a predetermined voltage or less;
   a non-volatile first memory storing status information indicating whether or not the supply of the external power to the power supply circuit is properly stopped and indicating whether or not the power supply circuit has properly stopped the generation of the plurality of kinds of power; and a fourth counter configured to count, based on the status information, the number of times that the supply of the external power to the power supply circuit is properly stopped, and the number of times that the supply of the external power to the power supply circuit is abnormally stopped.

2. The electronic device according to claim 1, wherein the first counter is operated by the external power, and
the fourth counter is operated by the plurality of kinds of powers generated by the power supply circuit.

3. The electronic device according to claim 1, further comprising:

a determination circuit configured to determine, based on a count value of the first counter, a count value of the second counter, a count value of the third counter, a count value of the fourth counter, and the status information, whether a cause of an operation stop of the electronic device is a proper stop of the supply of the external power to the power supply circuit, an improper stop of the supply of the external power to the power supply circuit, a proper stop of power generation of the power supply circuit, or an abnormal stop of power generation of the power supply circuit.

4. The electronic device according to claim 3, wherein the first memory further stores the number of times that the supply of the external power to the power supply circuit is properly stopped, the number of times that the supply of the external power to the power supply circuit is improperly stopped, the number of times that the power generation of the power supply circuit is properly stopped, and the number of times that power generation of the power supply circuit is abnormally stopped.

5. The electronic device according to claim 1, further comprising:

a write circuit configured to write the status information into the first memory when the supply of the external power to the power supply circuit is stopped.

6. The electronic device according to claim 1, wherein the electronic device is connected to a host that generates the external power,
the electronic device further comprises a volatile second memory storing data transmitted from the host, and
the electronic device is configured to write the data stored in the second memory into the first memory in response to a shutdown command transmitted from the host, notify the host of write completion, write log data indicating that the shutdown command is received into the first memory, and write the status information indicating whether or not the supply of the external power to the power supply circuit is properly stopped, based on the log data at startup into the first memory.

7. An information recording method of an electronic device including a power supply circuit that generates a plurality of kinds of powers from an external power, the information recording method comprising:

counting the number of times that supply of the external power to the power supply circuit is stopped;
counting the number of times that generation of the plurality of kinds of power is stopped;
counting the number of times that any of the plurality of kinds of power drops to a predetermined voltage or less;

writing status information indicating whether or not the supply of the external power to the power supply circuit is properly stopped and indicating whether or not the power supply circuit has properly stopped generation of the plurality of kinds of power into a first memory; and counting, based on the status information, the number of times that the supply of the external power to the power supply circuit is properly stopped and the number of times that the supply of the external power to the power supply circuit is abnormally stopped.

8. The information recording method according to claim 7, further comprising:

determining, based on the number of times that the supply of the external power to the power supply circuit is stopped, the number of times that the generation of the plurality of kinds of power is stopped, the number of times that any of the plurality of kinds of power drops to the predetermined voltage or less, the status information, the number of times that the supply of the external power to the power supply circuit is properly stopped, and the number of times that the supply of the external power to the power supply circuit is abnormally stopped, whether a cause of an operation stop of the electronic device is a proper stop of the supply of the external power to the power supply circuit, an improper stop of the supply of the external power to the power supply circuit, a proper stop of the power generation of the power supply circuit, or an abnormal stop of the power generation of the power supply circuit.

9. The information recording method according to claim 8, further comprising:

writing the number of times that the supply of the external power to the power supply circuit is properly stopped, the number of times that the supply of the external power to the power supply circuit is improperly stopped, the number of times that the power generation of the power supply circuit is properly stopped, and the number of times that the power generation of the power supply circuit is abnormally stopped into the first memory.

10. The information recording method according to claim 7, further comprising:

writing the status information into the first memory when the supply of the external power to the power supply circuit is stopped.

11. The information recording method according to claim 7, wherein the electronic device is connected to a host that generates the external power, and
the electronic device further comprises a volatile second memory for storing data transmitted from the host, and
the method further comprising:
the electronic device writing data stored in the second memory into the first memory in response to a shutdown command transmitted from the host, notifying the host of write completion, writing log data indicating that the shutdown command is received into the first memory, and writing the status information indicating whether or not the supply of the external power to the power supply circuit is properly stopped, based on the log data at startup.

* * * * *